United States Patent
Zhang et al.

(10) Patent No.: US 12,249,645 B2
(45) Date of Patent: Mar. 11, 2025

(54) LATERALLY DIFFUSED METAL OXIDE SEMICONDUCTOR DEVICE AND MANUFACTURING METHOD THEREFOR

(71) Applicant: CSMC TECHNOLOGIES FAB2 CO., LTD., Jiangsu (CN)

(72) Inventors: Zhili Zhang, Jiangsu (CN); Jingchuan Zhao, Jiangsu (CN); Sen Zhang, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 567 days.

(21) Appl. No.: 17/620,952

(22) PCT Filed: May 26, 2020

(86) PCT No.: PCT/CN2020/092270
§ 371 (c)(1),
(2) Date: Dec. 20, 2021

(87) PCT Pub. No.: WO2021/051856
PCT Pub. Date: Mar. 25, 2021

(65) Prior Publication Data
US 2022/0336657 A1    Oct. 20, 2022

(30) Foreign Application Priority Data

Sep. 17, 2019 (CN) .......................... 201910874283.5

(51) Int. Cl.
*H01L 29/78* (2006.01)
*H01L 29/10* (2006.01)
(Continued)

(52) U.S. Cl.
CPC ...... *H01L 29/7816* (2013.01); *H01L 29/1095* (2013.01); *H01L 29/408* (2013.01); *H01L 29/66681* (2013.01)

(58) Field of Classification Search
CPC combination set(s) only.
See application file for complete search history.

(56) References Cited

U.S. PATENT DOCUMENTS

| 8,232,593 B2 | 7/2012 | Saito et al. |
| 8,252,652 B2 * | 8/2012 | Chang ................. H01L 29/0634 438/286 |

(Continued)

FOREIGN PATENT DOCUMENTS

| CN | 1909200 A | 2/2007 |
| CN | 101714578 A | 5/2010 |

(Continued)

*Primary Examiner* — Mark W Tornow
*Assistant Examiner* — Priya M Rampersaud
(74) *Attorney, Agent, or Firm* — Muncy, Geissler, Olds & Lowe, P.C.

(57) ABSTRACT

A laterally diffused metal-oxide-semiconductor (LDMOS) device and a method of manufacturing the LDMOS device are disclosed. The method includes: obtaining a substrate with a drift region formed thereon, the drift region having a first conductivity type and disposed on the substrate of a second conductivity type; etching the drift region to form therein a sinking structure, the sinking structure includes at least one of an implanting groove and an implanting hole; implanting ions of the second conductivity type at the bottom of the sinking structure; forming a buried layer of the second conductivity type by causing diffusion of the ions of the second conductivity type using a thermal treatment; and filling an electrical property modification material into the sinking structure, the electrical property modification material differs from the material of the drift region.

14 Claims, 6 Drawing Sheets

(51) Int. Cl.
   *H01L 29/40* (2006.01)
   *H01L 29/66* (2006.01)

(56) References Cited

U.S. PATENT DOCUMENTS

| | | | |
|---|---|---|---|
| 9,153,666 B1* | 10/2015 | Iravani | H01L 29/7816 |
| 2002/0050613 A1* | 5/2002 | Rumennik | H01L 29/1083 |
| | | | 257/E29.066 |
| 2003/0006454 A1 | 1/2003 | Darwish | |
| 2003/0193067 A1* | 10/2003 | Kim | H01L 29/7801 |
| | | | 257/E29.256 |
| 2005/0112822 A1 | 5/2005 | Litwin | |
| 2006/0131644 A1 | 6/2006 | Saito et al. | |
| 2007/0023855 A1* | 2/2007 | Hossain | H01L 29/66659 |
| | | | 257/493 |
| 2010/0025756 A1 | 2/2010 | Fu et al. | |
| 2011/0233672 A1* | 9/2011 | Chang | H01L 29/66659 |
| | | | 257/E29.256 |
| 2015/0137229 A1* | 5/2015 | Sulistyanto | H01L 29/42368 |
| | | | 438/286 |
| 2016/0141369 A1* | 5/2016 | Kim | H01L 21/823418 |
| | | | 438/286 |
| 2017/0263727 A1 | 9/2017 | Mallikarjunaswamy et al. | |

FOREIGN PATENT DOCUMENTS

| | | |
|---|---|---|
| CN | 102593154 A | 7/2012 |
| CN | 103426932 A | 12/2013 |
| CN | 104112769 A | 10/2014 |
| CN | 104517852 A | 4/2015 |
| CN | 105789311 A | 7/2016 |
| CN | 105990139 A | 10/2016 |
| CN | 105990423 A | 10/2016 |
| CN | 106158631 A | 11/2016 |
| CN | 106972047 A | 7/2017 |
| CN | 108717946 A | 10/2018 |
| CN | 108807543 A | 11/2018 |
| JP | H09321291 A | 12/1997 |
| JP | 2011066067 A | 3/2011 |
| JP | 2013069998 A | 4/2013 |

* cited by examiner

LATERALLY DIFFUSED METAL OXIDE SEMICONDUCTOR DEVICE AND MANUFACTURING METHOD THEREFOR

TECHNICAL FIELD

The present invention relates to the fabrication of semiconductor devices, more particular to a laterally diffused metal-oxide-semiconductor (LDMOS) device and a method of manufacturing the LDMOS device.

BACKGROUND

For laterally diffused metal-oxide-semiconductor (LDMOS) devices, due to the trade-off between their breakdown voltage (BV) and on-resistance, designers would pursue a minimized on-resistance when a desirable breakdown voltage is ensured.

SUMMARY OF THE INVENTION

In view of this, it would be desirable to provide a laterally diffused metal-oxide-semiconductor (LDMOS) device with a reduced on-resistance while maintaining a desirable breakdown voltage, as well as a method of manufacturing such an LDMOS device.

The LDMOS device includes: a substrate of a second conductivity type; a drift region provided on the substrate and having a first conductivity type, the first conductivity type and the second conductivity type being opposite to each other; a buried layer of the second conductivity type disposed in the drift region; and a buried layer implantation auxiliary structure disposed on the buried layer of the second conductivity type and including a sinking structure, the sinking structure including at least one of an implanting groove and an implanting hole, the buried layer implantation auxiliary structure further including an electrical property modification material filled in the sinking structure, the electrical property modification material differing from a material of the drift region.

The method of manufacturing the LDMOS device includes: obtaining a substrate with a drift region formed thereon, the drift region having a first conductivity type and disposed on the substrate of a second conductivity type; etching the drift region to form therein a sinking structure including at least one of an implanting groove and an implanting hole; implanting ions of the second conductivity type at a bottom of the sinking structure; forming a buried layer of the second conductivity type by causing diffusion of the ions of the second conductivity type using a thermal treatment; and filling an electrical property modification material into the sinking structure, the electrical property modification material differing from a material of the drift region.

The details of one or more embodiments of this application are set forth in the accompanying drawings and the description below. Other features, improvements, and advantages of the application will be apparent from the description and drawings, and from the claims.

BRIEF DESCRIPTION OF THE DRAWINGS

In order to better describe and illustrate embodiments and/or examples of those inventions disclosed herein, reference may be made to one or more accompanying drawings. The additional details or examples used to describe the accompanying drawings should not be considered as limitations to the scope of any of the disclosed inventions, the presently described embodiments and/or examples, and the presently understood best mode of these inventions.

DETAILED DESCRIPTION

In order to facilitate an understanding of the present invention, the invention is described more fully below with reference to the accompanying drawings, which show preferred embodiments for practicing the invention. However, the present invention may be implemented in many different forms and should not be construed as limited to the embodiments set forth herein. Rather, these embodiments are provided so that this disclosure will be thorough and complete.

The terms in the field of semiconductor used herein are those commonly used by skilled artisans. For example, in order to distinguish different doping concentrations of p-type and n-type dopants, heavily, moderately and lightly-doped p-type regions are simply denoted as p+, p and p− regions, respectively, and heavily, moderately and lightly-doped n-type regions are simply denoted as n+, n and n− regions.

Figure 1:
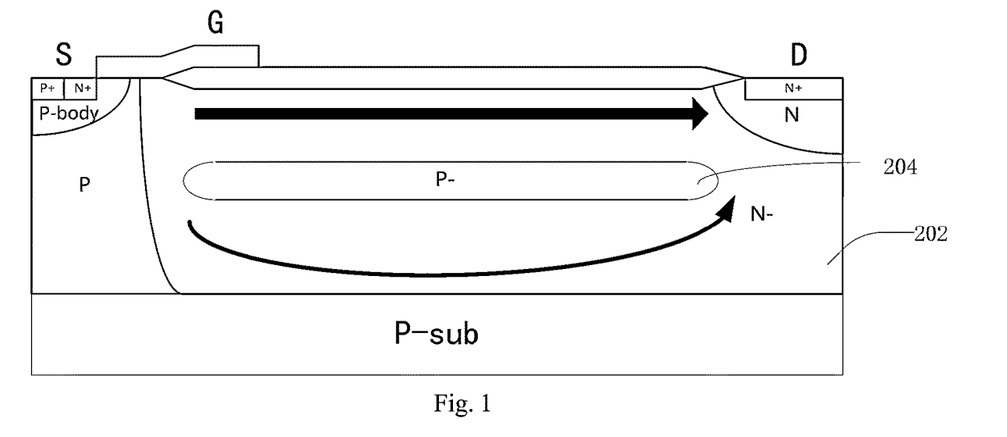
FIG. 1 is a structural schematic of a laterally diffused metal-oxide-semiconductor (LDMOS) device with p-type buried layers in a drift region according to an exemplary embodiment.

FIG. 1 is a structural schematic of a laterally diffused metal-oxide-semiconductor (LDMOS) device with p-type buried layers in a drift region according to an exemplary embodiment. The p-type buried (p-buried) layer 204 is formed by directly implanting p-type ions (e.g., boron ions) into the drift region 202 (n-well) using an ion implantation process. In this structure, there is a conductive channel in the drift region 202 above the p-type buried layers 204 and another conductive channel in the drift region 202 under the p-type buried layers 204 (e.g., as indicated by the two arrow in the figure). When the LDMOS device is turned off and under reverse voltage resistance, the p-type buried layers 204 can efficiently facilitate depletion of the n-type dopant in the drift region 202, raising the n-type dopant concentration in the drift region and lowering its on-resistance.

The inventors believe that the n-type conductive channel above the p-type buried layers 204 is the shortest source-to-drain conductive path, and the deeper it is, the smaller the overall on-resistance of the LDMOS device will be. However, limited by the maximum deliverable energy of the existing ion implantation apparatuses and other factors, the p-type ions can only reach a limited depth, narrowing the n-type conductive channel above the p-type buried layers 204 and thus weakening its electrical conduction power. Consequently, the on-resistance of the LDMOS device could not be significantly reduced.

Figure 2:
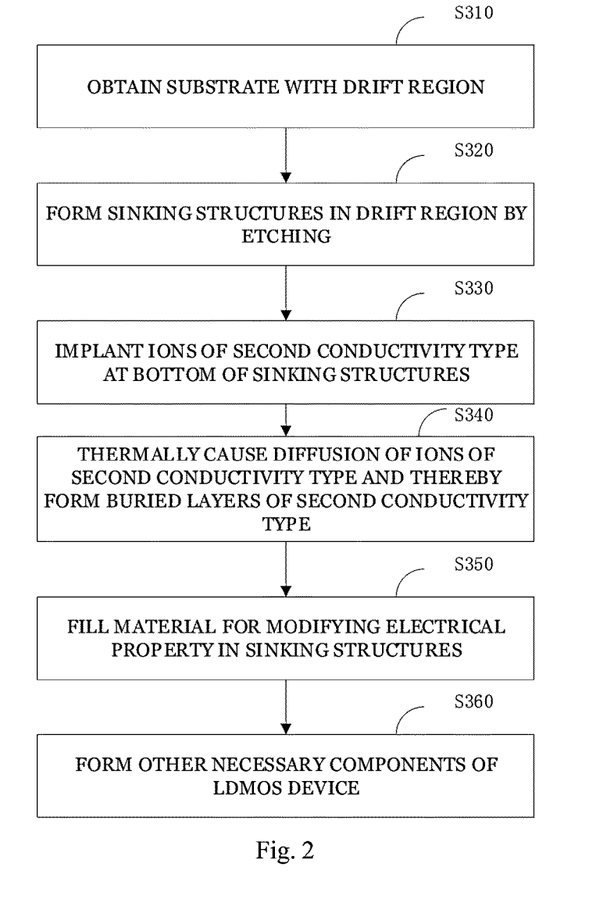
FIG. 2 is a flowchart of a method of manufacturing an LDMOS device according to an embodiment.

FIG. 2 is a flowchart of a method of manufacturing a laterally diffused metal-oxide-semiconductor (LDMOS) device according to one embodiment. The steps of the method are as follows.

S310: Obtain a substrate in which a drift region is formed.

The drift region of a first conductivity type may be formed on the substrate of a second conductivity type. In this embodiment, the LDMOS device is an n-type LDMOS (NLDMOS) device, in which the first conductivity type is n-type and the second conductivity type is p-type. In alternative embodiments, the first conductivity type may be p-type, while the second conductivity type may be n-type.

S320: Form sinking structures in the drift region by etching.

Figure 3A:
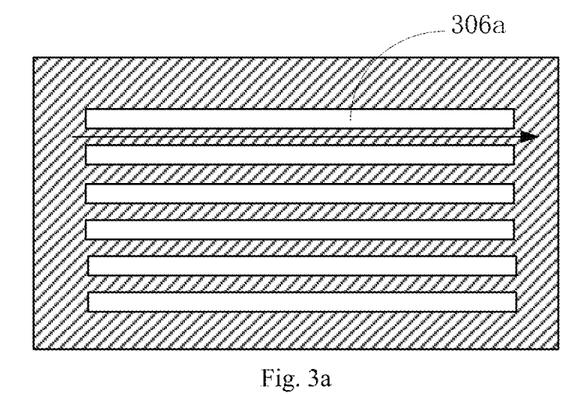
FIG. 3a is a top view of sinking structures according to one embodiment.
Figure 3B:
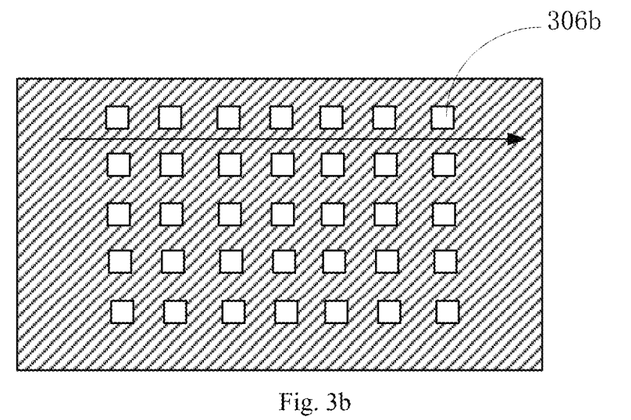
FIG. 3b is a top view of sinking structures according to another embodiment.
Figure 4A:
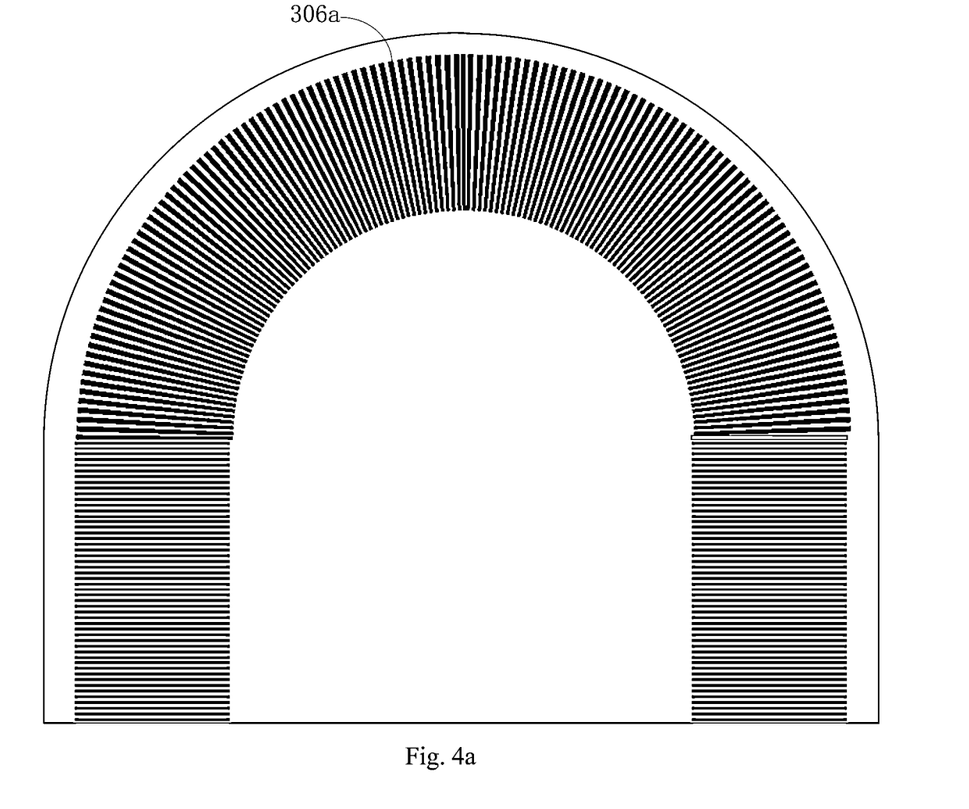
FIG. 4a schematically illustrates a layout of implanting grooves 306a in the embodiment of FIG. 3a, and FIG. 4b schematically illustrates a layout of implanting holes 306b in the embodiment of FIG. 3b.
Figure 4B:
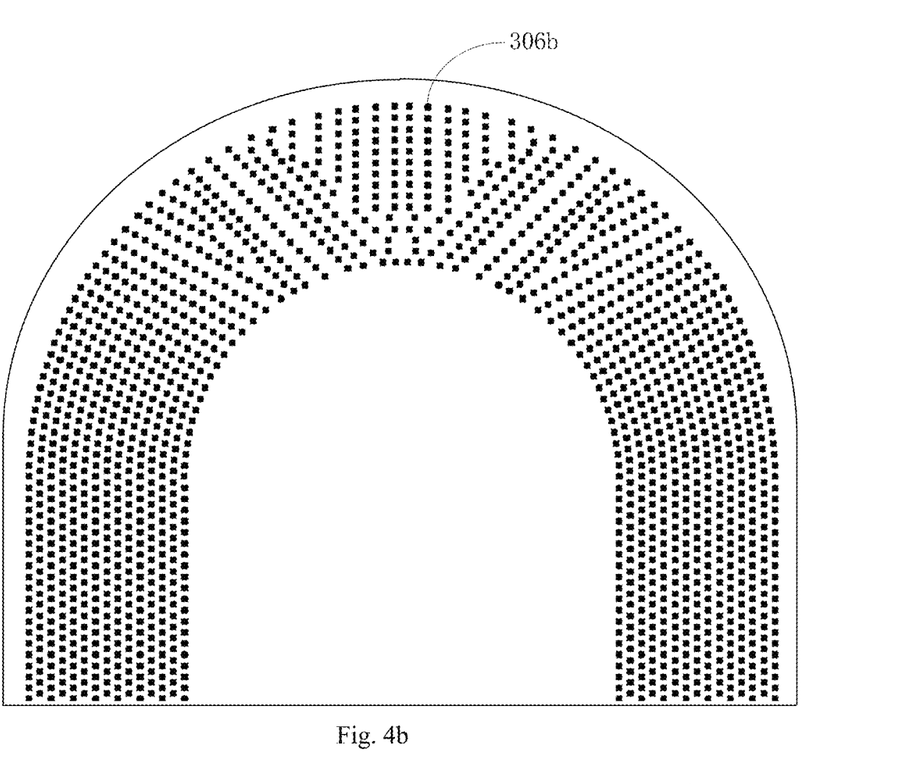

In this embodiment, implanting grooves and/or implanting holes for accommodating ion implantation are formed in a portion of the drift region. Ions subsequently implanted for forming the buried layers in the implanting grooves/implanting holes can reach a greater depth. It would be appreciated that a depth of the implanting grooves/implanting holes may depend on desired depths where the buried layers are to be formed. In one embodiment, the depth of the implanting grooves/implanting holes is greater than one micron. FIG. 3a is a top view of the sinking structures according to one embodiment, and FIG. 3b is a top view of the sinking structures according to another embodiment. In the embodiment of FIG. 3a, the sinking structures are multiple parallel implanting grooves 306a extending in a lengthwise direction of the resulting conductive channel to be formed. In the embodiment shown in FIG. 3b, the sinking structures are multiple implanting holes 306b arrayed in a matrix. In this way, during operation of the device, the portions of the drift region between the implanting grooves 306a or between the rows of the implanting holes 306b make up an n-type conductive channel, as indicated by the arrows in FIGS. 3a and 3b. FIG. 4a schematically illustrates a layout of the implanting grooves 306a in the embodiment of FIG. 3a, and FIG. 4b schematically illustrates a layout of the implanting holes 306b in the embodiment of FIG. 3b. As can be seen, the layouts of the implanting grooves 306a and implanting holes 306b are runway-shaped.

S330: Implant ions of the second conductivity type at the bottom of the sinking structures.

Figure 5:
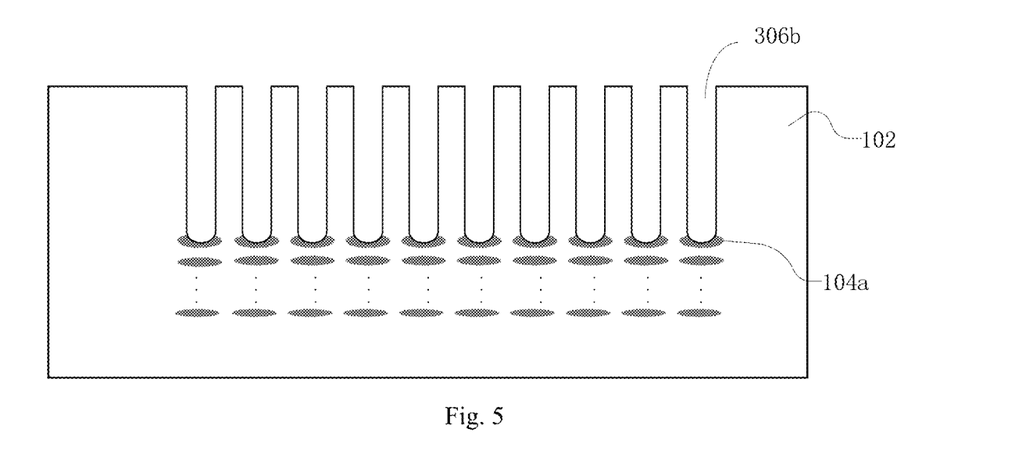
FIG. 5 shows a schematic cross-sectional view of a structure resulting from the implantation of ions of a second conductivity type in the implanting holes according to one embodiment.

In one embodiment, the ion implantation may be performed with the aid of a photoresist pattern remaining from a photolithography process carried out in step S320, resulting in the formation of doped regions at the bottom of the sinking structures. FIG. 5 shows a schematic cross-sectional view of a structure resulting from the implantation of ions of the second conductivity type in the implanting holes according to one embodiment. In the embodiment of FIG. 5, as a result of multiple implantation cycles carried out in step S330, each implantation cycle involving implanting ions to different depths, doped regions 104a located in layers at the different depths are formed. The ellipses in FIG. 5 represent multiple layers of doped regions 104a, illustration of which is omitted. In one embodiment, the ions of the second conductivity type are p-type ions such as boron ions.

S340: Thermally cause diffusion of the ions of the second conductivity type and thereby form buried layers of the second conductivity type.

Figure 6:
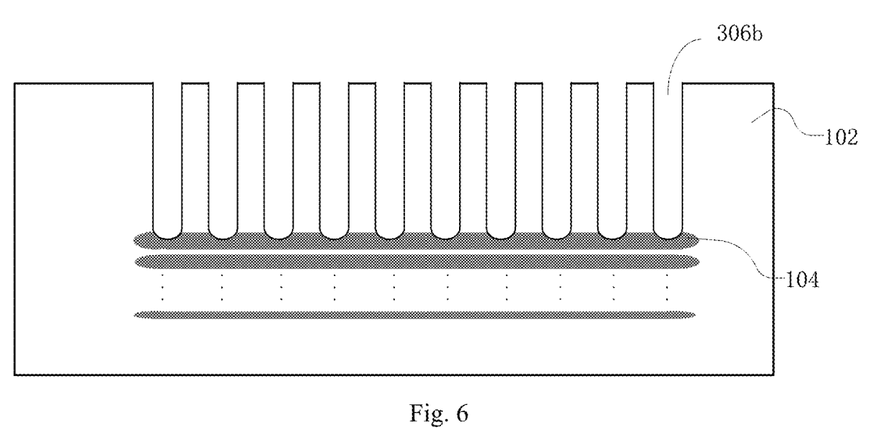
FIG. 6 is a schematic illustration of the structure of FIG. 5 that has undergone a thermal treatment.
Figure 7:
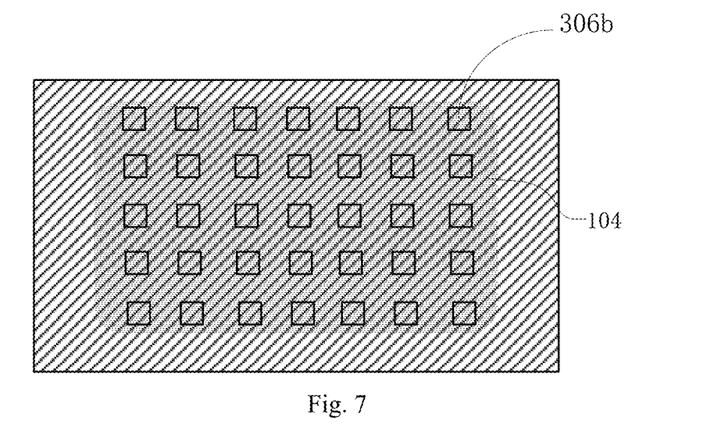
FIG. 7 shows a top view of the structure of FIG. 3b that has undergone a thermal treatment of implanted ions of the second conductivity type.

The structure resulting from step S330 is subject to a thermal treatment (thermal diffusion) so that the ions implanted via the implanting grooves 306a/implanting holes 306b diffuse and the doped regions 104a of each layer to expand to form a single layer. In the foregoing embodiment where multiple implantation cycles are performed in step S330, as a result of the thermal treatment, multiple buried layers of the second conductivity type are formed at the different depths, as shown in FIGS. 6 and 7. The thermal treatment in step S340 may be annealing or well drive-in, for example. It would be appreciated that step S340 may either precede or succeed S350.

S350: Fill an electrical property modification material in the sinking structures.

The filled electrical property modification material may modify an electrical property as required by the device. In one embodiment, the material may be a dielectric material containing, for example, at least one of silicon dioxide, silicon nitride, silicon oxynitride and hafnium oxide. The filling of the dielectric material may be accomplished by physical vapor deposition (PVD), chemical vapor deposition (CVD), thermal oxide growth or the like. The dielectric material filled in the sinking structures can impart a higher breakdown voltage and enhanced stability to the LDMOS device under reverse voltage resistance. In another embodiment, the material may be polysilicon.

S360: Form other necessary components of the LDMOS device.

In one embodiment, the formation in step S360 can be accomplished by conventional processes.

In this method, the ion implantation performed in the implanting grooves and/or implanting holes enables the buried layers of the second conductivity type to be formed at greater depths depending on the depth of the implanting grooves/implanting holes without being limited by the maximum deliverable energy of the used implantation apparatus. In this way, a resulting conductive channel in the drift region above the buried layers can have a sufficient depth, which enables the buried layers of the second conductivity type to efficiently facilitate depletion of the dopant of the first conductivity type in the drift region when the LDMOS device is turned off and under reverse voltage resistance, thus raising the concentration of the dopant of the first conductivity type in the drift region and lowering its on-resistance. Moreover, the material filled in the implanting grooves/implanting holes can optimize an electrical property of the device. Compared to solutions involving the formation of buried layers by ion implantation and subsequent epitaxial growth, the method of the present invention saves both cost and process time. Further, in contrast to epitaxy that is not applicable to local growth, the method of the present invention can be further used in applications requiring the local formation of buried layers.

In one embodiment, step S360 may include the steps as detailed below.

A well of the first conductivity type and a well of the second conductivity type are formed. The well of the first conductivity type may serve as a drain-side buffer for the drift region, which enables the LDMOS device to have an increased on-state breakdown voltage when it is forward conducting. The well of the second conductivity type may serve as a channel region of the device, and its dopant concentration may also affect the depletion of the drift region and a turn-on voltage of the device. In this embodiment, the well of the first conductivity type is an n-well, and the well of the second conductivity type is a p-well.

A field oxide layer is formed on the drift region.

A gate is formed. In this embodiment, the gate may be formed of polysilicon and extend beyond edges of the field oxide layer onto the well of the second conductivity type.

A source region, a drain region and a substrate lead-out region are formed. Using ion implantation, the source region and the substrate lead-out region may be formed in the well of the second conductivity type and the drain region in the well of the first conductivity type. In this embodiment, the source and drain regions are n+ regions, and the substrate lead-out region is a p+ region.

An interlayer dielectric (ILD) layer is formed. The ILD layer may be formed on a surface of the wafer resulting from the last step.

Contact implanting holes are formed. Each contact implanting hole may be formed by etching in the ILD layer so as to lead a respective structure to the device's surface.

Metal electrodes for gate, drain and source are formed.

Figure 8:
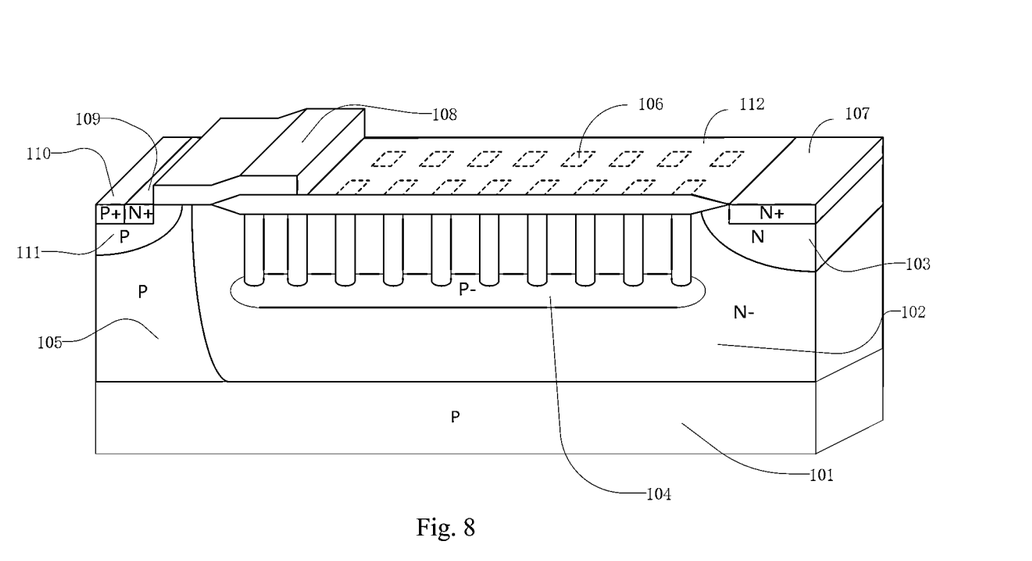
FIG. 8 is a structural schematic of an LDMOS device according to an embodiment.

Herein, there is also provided a corresponding laterally diffused metal-oxide-semiconductor (LDMOS) device. FIG. 8 is a structural schematic of the LDMOS device according to one embodiment. As shown, the LDMOS device includes a substrate 101, a drift region 102, one or more buried layers 104 of the second conductivity type and an auxiliary structure 106 for supporting ion implantation for forming the buried layers. The auxiliary structure includes sinking structures including at least one of implanting grooves and implanting holes. In this embodiment, they are implanting holes. Moreover, the LDMOS device is an n-type LDMOS (NLDMOS) device in which the substrate 101 is a p-type substrate, the drift region 102 is an n-type drift region (n-drift region) provided on the substrate 101, and the buried layers 104 are p-type buried layers (p-buried layers). The buried layers 104 are located within the drift region 102, and the auxiliary structure 106 is situated above the buried layers 104. When there is only one buried layer 104 of the second conductivity type, the implanting grooves/implanting holes may extend downward partially into the buried layer 104. When there are multiple buried layers 104 of the second conductivity type, the implanting grooves/implanting holes may extend downward partially into the topmost one of the layers. Since the buried layers 104 are formed by ion implantation performed in the implanting grooves and/or implanting holes, they are located at greater depths depending on a depth of the implanting grooves/implanting holes without being limited by the maximum deliverable energy of the used implantation apparatus. An electrical property modification material of the device as desired, which differs from the material of the drift region 102, is filled in the implanting grooves/implanting holes.

In this LDMOS device, since the buried layers of the second conductivity type are formed by ion implantation performed in the implanting grooves and/or implanting holes, they are located at greater depths depending on the depth of the implanting grooves/implanting holes without being limited by the maximum deliverable energy of the used implantation apparatus. In this way, a resulting conductive channel in the drift region above the buried layers can have a sufficient depth, which enables the buried layers of the second conductivity type to efficiently facilitate depletion of the dopant of the first conductivity type in the drift region when the LDMOS device is turned off and under reverse voltage resistance, thus raising the concentration of the dopant of the first conductivity type in the drift region and lowering its on-resistance. Moreover, the material filled in the implanting grooves/implanting holes can optimize an electrical property of the device.

In the embodiment of FIG. 8, the LDMOS device further includes a source region 109, a drain region 107, a field oxide layer 112, a gate 108 and a substrate lead-out region 110. The auxiliary structure 106 is disposed between the n-type source region 109 and the n-type drain region 107 (both are n+ regions in the embodiment of FIG. 8). The field oxide layer 112 is disposed on the drift region 102. As the implanting holes underlie and, are shielded by, the field oxide layer 112, they are indicated by dashed boxes in FIG. 8. The gate 108 is formed of polysilicon and extends from the field oxide layer 112 toward the source region 109. The substrate lead-out region 110 is a p-region (or a p+ region), which is disposed on the side of the source region 109 away from the gate 108 and is brought into contact with the source region 109.

In the embodiment of FIG. 8, both the source region 109 and the substrate lead-out region 110 are formed in a well 111 of the second conductivity type, whilst the drain region 107 is formed in a well 103 of the first conductivity type. In the embodiment of FIG. 8, the well 103 of the first conductivity type is an n-well, and the well 111 of the second conductivity type is a p-well. The well 103 of the first conductivity type may serve as a drain-side buffer for the drift region, which enables the LDMOS device to have an increased on-state breakdown voltage when it is forward conducting. The well 111 of the second conductivity type can enable the channel region to have a reduce length, resulting a reduction in the device's size. A dopant concentration of a source-side region 105 may affect the depletion of the drift region and a threshold voltage.

In one embodiment, in order to achieve a high breakdown voltage, the substrate 101 may be selected as a material having a high resistivity, which facilitates depletion of the substrate.

In one embodiment, the drift region 102 may be formed by ion implantation followed by junction drive-in at a high temperature. In another embodiment, the drift region 102 may be formed by epitaxial growth. The drift region 102 must have a specified depth for ensuring depletion of the device substrate and a desirable current conduction path.

In one embodiment, the electrical property modification material may be a dielectric material including, for example, at least one of silicon dioxide, silicon nitride, silicon oxynitride and hafnium oxide. This dielectric material filled in the sinking structures can impart a higher breakdown voltage and enhanced stability to the LDMOS device under reverse voltage resistance. In another embodiment, the material is polysilicon. In another embodiment, the material may be polysilicon.

In one embodiment, the implanting grooves and/or implanting holes may have a depth greater than 1 micron.

Figure 9:
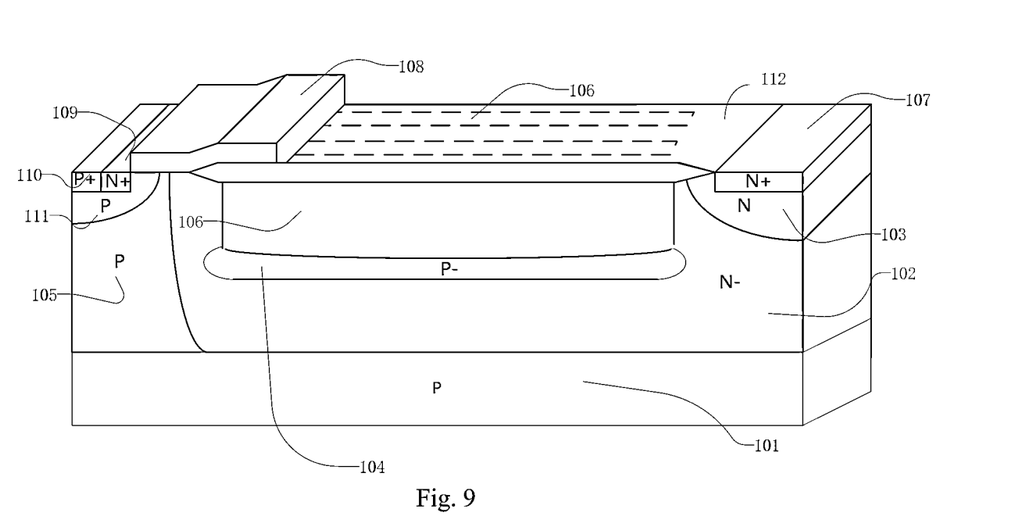
FIG. 9 is a structural schematic of an LDMOS device according to another embodiment.

FIG. 9 is a structural schematic of a laterally diffused metal-oxide-semiconductor (LDMOS) device according to another embodiment, which differs from the LDMOS device of FIG. 8 mainly in that the auxiliary structure 106 includes implanting grooves (rather than the implanting holes of FIG. 8).

The above embodiments represent merely a few modes of carrying out the present invention. Although these embodiments have been described specifically and in detail, they should not be construed as limiting the scope of the invention in any sense. It is to be noted that although various changes and modifications can be made by those of ordinary skill in the art without departing from the spirit of the invention, all of these come within the scope of the invention as defined by the appended claims.

What is claimed is:

1. A laterally diffused metal-oxide-semiconductor (LDMOS) device, comprising:
   a substrate of a second conductivity type;
   a drift region provided on the substrate and having a first conductivity type, the first conductivity type and the second conductivity type being opposite to each other;
   a plurality of buried layers of the second conductivity type with different depths disposed in the drift region; and
   a buried layer implantation auxiliary structure disposed on the plurality of buried layers of the second conductivity type and comprising a sinking structure, the sinking structure including at least one of an implanting groove and an implanting hole, the buried layer implantation auxiliary structure further comprising an electrical property modification material filled in the sinking structure, the electrical property modification material differing from a material of the drift region.

2. The LDMOS device of claim 1, further comprising:
   a source region of the first conductivity type;
   a drain region of the first conductivity type;
   a field oxide layer provided on the buried layer implantation auxiliary structure;
   a gate extending from a side of the field oxide layer adjacent to the source region toward the source region; and
   a substrate lead-out region of the second conductivity type provided on a side of the source region away from the gate, the substrate lead-out region being in contact with the source region.

3. The LDMOS device of claim 1, wherein the electrical property modification material is a dielectric material.

4. The LDMOS device of claim 3, wherein the electrical property modification material is at least one of silicon dioxide, silicon nitride, silicon oxynitride and hafnium oxide.

5. The LDMOS device of claim 1, wherein the plurality of buried layers of the second conductivity type are provided with a plurality of sinking structures.

6. The LDMOS device of claim 1, wherein the sinking structure has a depth of greater than 1 µm.

7. The LDMOS device of claim 2, further comprising a well of the first conductivity type and a well of the second conductivity type, wherein the drain region is provided in the well of the first conductivity type, and wherein both the source region and the substrate lead-out region are provided in the well of the second conductivity type.

8. The LDMOS device of claim 1, wherein the first conductivity type is n-type, and the second conductivity type is p-type.

9. A method of manufacturing a laterally diffused metal-oxide-semiconductor (LDMOS) device, comprising:
   obtaining a substrate with a drift region formed thereon, the drift region having a first conductivity type and disposed on the substrate of a second conductivity type;
   etching the drift region to form therein a sinking structure including at least one of an implanting groove and an implanting hole;
   implanting ions of the second conductivity type at a bottom of the sinking structure;
   forming a plurality of buried layers of the second conductivity type by causing diffusion of the ions of the second conductivity type using a thermal treatment; and
   filling an electrical property modification material into the sinking structure, the electrical property modification material differing from a material of the drift region,
   wherein the step of implanting ions of the second conductivity type at the bottom of the sinking structure comprises a plurality of implantation cycles each involving implanting the ions to a different depth so that the plurality of buried layers of the second conductivity type are formed at different depths.

10. The method of claim 9, further comprising, after filling the electrical property modification material into the sinking structure:
    forming a field oxide layer above the electrical property modification material;
    forming a gate; and
    forming a source region of the first conductivity type, a drain region of the first conductivity type and a substrate lead-out region of the second conductivity type.

11. The method of claim 9, wherein the electrical property modification material is a dielectric material.

12. The method of claim 9, wherein the filling of the electrical property modification material into the sinking structure is accomplished by a deposition or thermal oxidation process.

13. The method of claim 9, wherein a plurality of sinking structures are formed, and wherein the step of forming the plurality of buried layers of the second conductivity type by causing diffusion of the ions of the second conductivity type using the thermal treatment comprises diffusion and joining of separate regions of ions of the second conductivity type resulting from the implantation step to form the plurality of buried layers of the second conductivity type.

14. The method of claim 10, wherein prior to the formation of the field oxide layer above the electrical property modification material, the method further comprises forming a well of the first conductivity type and a well of the second conductivity type, wherein the step of forming the source region of the first conductivity type, the drain region of the first conductivity type and the substrate lead-out region of the second conductivity type comprises forming the source region and the substrate lead-out region in the well of the second conductivity type and forming the drain region in the well of the first conductivity type using ion implantation process, and wherein subsequent to the formation of the source region of the first conductivity type, the drain region of the first conductivity type and the substrate lead-out region of the second conductivity type, the method further comprises:
    forming an interlayer dielectric layer;
    forming contact implanting holes; and
    forming metal electrodes for the gate, the drain region and the source region.

* * * * *